(12) United States Patent
Fujikawa et al.

(10) Patent No.: US 9,007,738 B2
(45) Date of Patent: Apr. 14, 2015

(54) TRANSISTOR PROTECTION CIRCUIT

(71) Applicants: Sumitomo Electric Industries, Ltd., Osaka-shi (JP); National University Corporation Toyohashi University of Technology, Toyohashi-shi (JP)

(72) Inventors: Kazuhiro Fujikawa, Osaka (JP); Nobuo Shiga, Osaka (JP); Takashi Ohira, Toyohashi (JP); Kazuyuki Wada, Toyohashi (JP); Tuya Wuren, Toyohashi (JP)

(73) Assignees: Sumitomo Electric Industries, Ltd., Osaka-shi (JP); National University Corporation Toyohashi University of Technology, Toyohashi-shi (JP)

( * ) Notice: Subject to any disclaimer, the term of this patent is extended or adjusted under 35 U.S.C. 154(b) by 255 days.

(21) Appl. No.: 13/665,342

(22) Filed: Oct. 31, 2012

(65) Prior Publication Data

US 2013/0120890 A1  May 16, 2013

Related U.S. Application Data

(60) Provisional application No. 61/559,978, filed on Nov. 15, 2011.

(30) Foreign Application Priority Data

Nov. 15, 2011   (JP) .................................. 2011-249238

(51) Int. Cl.
*H02H 9/04* (2006.01)
*H02M 1/08* (2006.01)
*H02M 1/32* (2007.01)
*H03K 17/082* (2006.01)
*H03K 17/16* (2006.01)

(52) U.S. Cl.
CPC *H02M 1/08* (2013.01); *H02M 1/32* (2013.01); *H03K 17/0822* (2013.01); *H03K 17/163* (2013.01)

(58) Field of Classification Search
USPC ......................................................... 361/91.3
See application file for complete search history.

(56) References Cited

U.S. PATENT DOCUMENTS 5,500,619 A * 3/1996 Miyasaka ..................... 327/427
2012/0075753 A1 * 3/2012 Watanabe et al. ............... 361/18

FOREIGN PATENT DOCUMENTS

JP       10-276075       10/1998
JP       2008-141841 A   6/2008

OTHER PUBLICATIONS

International Preliminary Report on Patentability and Written Opinion in PCT International Application No. PCT/JP2012/076990, dated Jun. 19, 2014.

*Primary Examiner* — Thienvu Tran
*Assistant Examiner* — Kevin J Comber
(74) *Attorney, Agent, or Firm* — Venable LLP; Michael A. Sartori; F. Brock Riggs

(57) ABSTRACT

Provided is a transistor protection circuit capable of appropriately protecting a transistor even when a switching frequency is high. A transistor protection circuit according to an embodiment of the present invention is a transistor protection circuit for protecting a voltage-driven transistor that is switch-controlled by the application of a high-potential-side voltage or low-potential-side voltage of a power supply to a gate terminal of the transistor by a drive circuit. The transistor protection circuit has a power supply controller that gradually lowers the high-potential-side voltage of the power supply upon receiving a protection command for executing protection of the transistor.

7 Claims, 2 Drawing Sheets

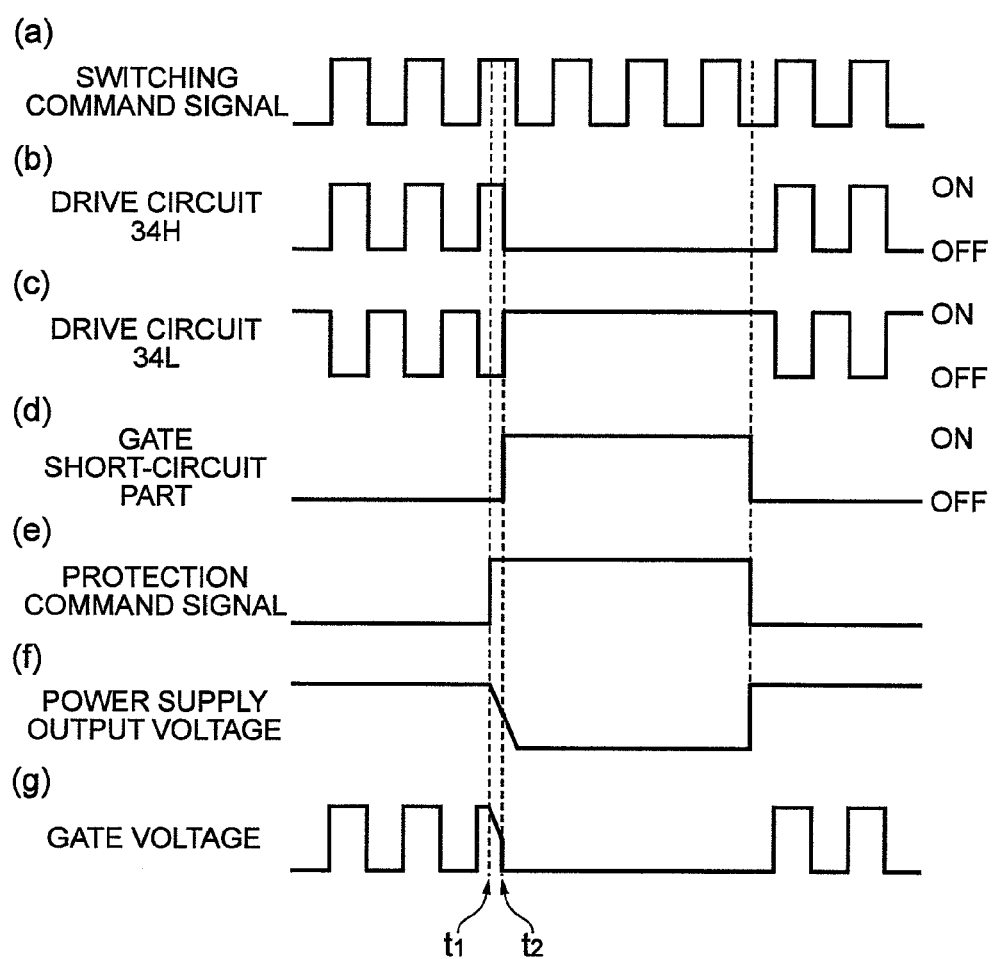

TRANSISTOR PROTECTION CIRCUIT

CROSS-REFERENCE TO RELATED APPLICATION

This application claims priority to Provisional Application No. 61/559,978 filed on Nov. 15, 2011 and claims the benefit of Japanese Patent Application No. 2011-249238 filed on Nov. 15, 2011, all of which are incorporated herein by reference in their entirety.

BACKGROUND OF THE INVENTION

1. Field of the Invention

The present invention relates to a transistor protection circuit for protecting a transistor of a power electronics circuit and the like.

2. Related Background Art

There is designed a protection circuit for protecting a transistor of a power electronics circuit when an abnormal operation occurs in the transistor (e.g., the occurrence of overcurrent, overvoltage, high temperature). Japanese Patent Application Publication No. 2008-141841 discloses an overcurrent protection circuit that restricts the flow of current in a voltage-driven transistor of an inverter. When it is detected that an overcurrent flows through a transistor SW, this overcurrent protection circuit 40 gradually lowers a voltage to be applied to a gate terminal of the transistor SW, by turning the transistor of a soft interruption circuit 49 ON, and then soft-interrupts the transistor SW. This soft interruption can prevent an excessive surge voltage from occurring during the short circuit.

In addition, when performing the soft interruption, the overcurrent protection circuit 40 causes a drive circuit 30 for driving the transistor SW to stop supplying voltage to the gate terminal of the transistor SW. Specifically, the drive circuit 30 is caused to turn ON a transistor 31p for supplying a high-potential-side voltage and a transistor 31n for supplying a low-potential-side voltage.

SUMMARY OF THE INVENTION

Incidentally, due to the recent arrivals of SiC devices capable of realizing extremely low switching loss, the switching frequencies for power electronics circuits are hoped to be increased (e.g., approximately 5 to 10 times, or 100 kHz or more).

However, in the protection circuit described in Japanese Patent Application Publication No. 2008-141841, an increase in switching frequency might disable soft interruption due to an operation delay time period of the drive circuit 30. More specifically, when the transistor of the soft interruption circuit 49 is turned ON to perform the soft interruption, the transistors 31p, 31n of the drive circuit 30 need to be turned OFF at the same time. However, due to delay time periods of a control circuit 35 and the like of the drive circuit 30, it takes long to turn the transistors 31p, 31n OFF. As a result, the soft interruption might fail to be performed as scheduled. This delay is caused by the increase in switching frequency.

An object of the present invention is to provide a transistor protection circuit capable of appropriately protecting a transistor even when a switching frequency is high.

A transistor protection circuit of the present invention is a transistor protection circuit for protecting a voltage-driven transistor that is switch-controlled by the application of a high-potential-side voltage or low-potential-side voltage of a power supply to a gate terminal of the transistor by a drive circuit, the transistor protection circuit having a power supply controller that gradually lowers the high-potential-side voltage of the power supply upon receiving a protection command for executing protection of the transistor.

According to this transistor protection circuit, because the high-potential-side voltage of the power supply, which is the voltage to be applied to the gate terminal of the transistor, is gradually lowered by the power supply controller, soft interruption for gradually turning the transistor OFF can be performed appropriately without relying on an operation delay time period of the drive circuit. Therefore, the transistor can be protected appropriately without relaying on a switching frequency.

The transistor protection circuit described above further has a gate short-circuit part for causing short circuit in the gate terminal and a source or emitter terminal of the transistor, and a short-circuit controller for controlling the gate short-circuit part so as to cause short circuit in the gate terminal and the source or emitter terminal of the transistor in response to the protection command. The short-circuit controller may control the gate short-circuit part so as to cause short circuit in the gate terminal and the source or emitter terminal of the transistor after a predetermined delay time period elapses since the reception of the protection command.

According to this configuration, lowering the high-potential-side voltage of the power supply by means of the power supply controller can be stopped after a lapse of the predetermined delay time period. For instance, this power supply voltage is sometimes used in another circuit in a power electronics circuit. In such a case, the power supply voltage can be prevented from declining more than necessary, and discontinuation of the operation of the abovementioned circuit in the power electronics circuit can be avoided.

The predetermined delay time period described above may be equal to or longer than a time period required for the voltage, which is applied to the gate terminal of the transistor, to decline to a threshold voltage of the transistor.

According to this configuration, after the gate voltage of the transistor declines to the threshold voltage or lower, the short-circuit controller causes short circuit in the gate terminal of the transistor. Accordingly, the occurrence of an excessive surge voltage during short circuit can be prevented.

The transistor protection circuit described above further has a drive controller that controls the drive circuit so as to stop the application of the high-potential-side voltage of the power supply to the gate terminal of the transistor in response to the protection command. The drive controller may control the drive circuit so as to stop the application of the high-potential-side voltage of the power supply to the gate terminal of the transistor after a predetermined delay time period elapses since the reception of the protection command. The predetermined delay time period in the drive controller may be the same as the predetermined delay time period in the short-circuit controller mentioned above.

According to this configuration, lowering the high-potential-side voltage of the power supply by means of the power supply controller can be stopped after a lapse of the predetermined delay time period. Therefore, for instance, when this power supply voltage is sometimes used in another circuit in a power electronics circuit, the power supply voltage can be prevented from declining more than necessary, and discontinuation of the operation of the abovementioned circuit in the power electronics circuit can be avoided.

Before the predetermined delay time period elapses since the reception of the protection command, the drive controller described above may control the drive circuit so as to continue the application of the high-potential-side voltage of the power supply to the gate terminal of the transistor.

According to this configuration, the power supply controller can appropriately perform soft interruption of the transistor prior to the lapse of the predetermined delay time period.

The present invention can appropriately protect the transistor even when the switching frequency is high.

BRIEF DESCRIPTION OF THE DRAWINGS

FIG. 2 is a diagram showing waveforms of the parts provided in the transistor protection circuit shown in FIG. 1.

DESCRIPTION OF THE PREFERRED EMBODIMENTS

Figure 1:
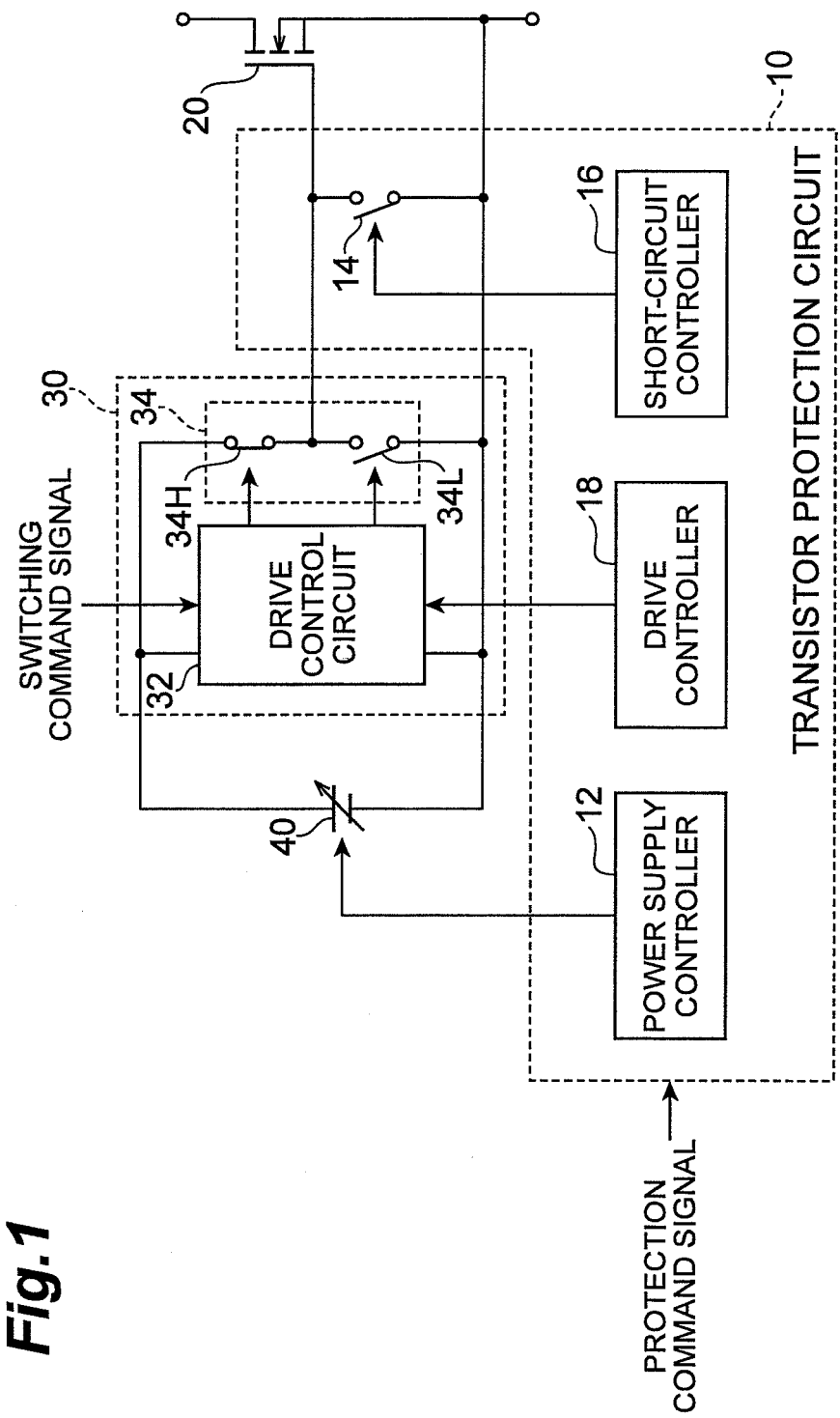
FIG. 1 is a circuit diagram showing a transistor protection circuit according to an embodiment of the present invention.

A preferred embodiment of the present invention is described hereinafter in detail with reference to the drawings. Note that the same reference numerals are used to indicate the same or like components in each of the drawings.

FIG. 1 is a circuit diagram showing a transistor protection circuit according to the embodiment of the present invention. FIG. 1 shows a part of a power electronics circuit including a transistor 20 to be protected by a transistor protection circuit 10.

First of all, the illustrated power electronics circuit is described before explaining the transistor protection circuit 10. Examples of the power electronics circuit include an inverter. The inverter has two or three series circuits in parallel, each of which has two of the transistors 20 connected in series. Examples of each transistor 20 include a voltage-driven transistor such as IGBT and FBI. This type of transistor 20 is voltage-driven by a drive circuit 30 as shown in FIG. 1.

The drive circuit 30 is operated by a power supply voltage supplied from a power supply 40. The drive circuit 30 has a drive control circuit 32 and selection circuit 34. In the selection circuit 34, two switch elements 34H, 34L are connected in series between a high-voltage-side potential and a low-voltage-side potential of the power supply 40, and an intermediate node between the switch elements 34H, 34L is connected to a gate terminal of each transistor 20. An emitter or source terminal of the transistor 20 is connected to the low-voltage-side potential of the power supply 40. The drive circuit 30 performs, for example, PWM control on the ON/OFF switching operation of the transistor 20 in response to a switching command signal for controlling an output of the inverter. Specifically, when the drive control circuit 32 turns the switch element 34H ON and the switch element 34L OFF, a high-potential-side voltage is supplied to the gate terminal of the transistor 20. When the drive control circuit 32 turns the switch element 34H OFF and the switch element 34L ON, a low-potential-side voltage is supplied to the gate terminal of the transistor 20.

When an abnormal operation occurs in this type of transistor 20 (e.g., the occurrence of overcurrent, overvoltage, high temperature) and detected by a detection circuit (not shown), a protection command signal for executing protection of the transistor is input to the transistor protection circuit 10. In response to this protection command signal, the transistor protection circuit 10 executes a protection operation on the transistor 20.

The transistor protection circuit 10 has a power supply controller 12, gate short-circuit part 14, short-circuit controller 16, and drive controller 18.

The power supply controller 12 controls the power supply 40 in response to the protection command signal and lowers the power supply voltage. Specifically, the power supply controller 12 gradually lowers the high-potential-side voltage of the power supply 40 immediately after the protection command signal is received. When the protection command signal is received, the switch element 34H of the selection circuit 34 is turned ON. Consequently, the power supply controller 12 gradually lowers the voltage applied to the gate terminal of the transistor 20 (soft interruption).

The gate short-circuit part 14 includes a switch element for causing short circuit in the gate terminal and the source or emitter terminal of the transistor 20 and is connected between the gate terminal of the transistor 20 and the source or emitter terminal (i.e., the low-potential side of the power supply 40) of the same. The gate short-circuit part 14 is controlled by the short-circuit controller 16.

The short-circuit controller 16 controls the gate short-circuit part 14 in response to the protection command signal and causes short circuit in the gate terminal of the transistor 20. Specifically, the short-circuit controller 16 causes short circuit in the gate terminal and the source or emitter terminal of the transistor 20 after a predetermined delay time period elapses since the reception of the protection command signal. The predetermined delay time period is set to be, for example, equal to or longer than a time period required for the gate voltage of the transistor 20 to decline to a threshold voltage. Such predetermined delay time period can be predicted from a time constant or the like of decrease in power supply voltage, and can be, for example, set in advance.

The drive controller 18 controls the drive circuit 30 in response to the protection command signal and controls supply of voltage to the gate terminal of the transistor 20. Specifically, after the predetermined delay time period elapses since the reception of the protection command signal, the drive controller 18 turns the switch element 34H of the selection circuit 34 OFF and stops the application of the high-potential-side voltage of the power supply 40 to the gate terminal of the transistor 20. In so doing, the drive controller 18 may turn the switch element 34L of the selection circuit 34 ON to cause short circuit in the gate terminal of the transistor 20.

The drive controller 18 also continues the application of the high-potential-side voltage of the power supply 40 to the gate terminal of the transistor 20 while keeping the switch element 34H of the selection circuit 34 ON before the predetermined delay time period elapses since the reception of the protection command signal.

Next, operations of the transistor protection circuit 10 are described. FIG. 2 is a diagram showing waveforms of the transistor protection circuit 10 and the parts to be protected/controlled.

First, when the transistor 20 is operating normally, the switch elements 34H, 34L of the selection circuit 34 of the drive circuit 30 are turned ON and OFF alternately in response to the switching command signal ((b) and (c) of FIG. 2), and a drive voltage is supplied to the gate terminal of the transistor 20 ((g) of FIG. 2).

Subsequently, at time t1, when an abnormal operation is detected in the transistor 20 and a high-level protection command signal is received ((e) of FIG. 2), the power supply controller 12 gradually lowers an output voltage of the power supply 40 in the transistor protection circuit 10 ((f) of FIG. 2). At this moment, the drive controller 18 keeps the switch element 34H of the selection circuit 34 ON ((b) of FIG. 2). Consequently, the gate voltage of the transistor 20 is gradually lowered, and soft interruption is performed on the transistor 20 ((g) of FIG. 2).

After a lapse of the predetermined delay time period since the time t1, the short-circuit controller 16 and the gate short-circuit part 14 cause short circuit in the gate terminal and the source or emitter terminal of the transistor 20 at a time t2 ((d) of FIG. 2). At this moment, the drive controller 18 turns the switch element 34H of the selection circuit 34 OFF ((b) of FIG. 2). The drive controller 18 also turns the switch element 34L of the selection circuit 34 ON ((c) of FIG. 2). At this moment, the voltage to be applied to the transistor 20 is lowered to the threshold voltage of the transistor 20 or lower. Therefore, even when short circuit occurs, an excessive surge voltage is not generated.

Note that the power supply controller 12 stops the reduction of the output voltage of the power supply 40 at appropriate time when the voltage of the power supply 40 can no longer decline ((f) of FIG. 2).

Thereafter, when the transistor 20 returns to its normal operation state and the level of the protection command signal becomes low, the short-circuit controller 16 and the gate short circuit 14 removes the short circuit of the gate terminal of the transistor 20 ((d) of FIG. 2), and the drive controller 18 removes the short circuit of the switch element 34L of the selection circuit 34. As a result, the transistor 20 returns to its normal operation state mentioned above.

According to the transistor protection circuit 10 of the present embodiment described above, the high-potential-side voltage of the power supply 40, which is the voltage to be applied to the gate terminal of the transistor 20, is gradually lowered by the power supply controller 12 immediately after the reception of the protection command signal. Therefore, the soft interruption for gradually turning the transistor 20 OFF within a delay time period shorter than an operation delay time period of the drive circuit 30, can be performed appropriately without relying on the operation delay time period of the drive circuit 30. Consequently, even when a switching circuit is high, the transistor 20 can be protected appropriately without relying on the switching frequency.

In addition, according to the transistor protection circuit 10 of the present embodiment, because the short-circuit controller 16 and the gate short-circuit part 14 cause short circuit in the gate terminal of the transistor after the predetermined delay time period elapses since the reception of the protection command signal, lowering the high-potential-side voltage of the power supply by means of the power supply controller 12 can be stopped after the lapse of the predetermined delay time period. For example, this power supply voltage is sometimes used in another circuit in the power electronics circuit. In such a case, the power supply voltage can be prevented from declining more than necessary, and discontinuation of the operation of the abovementioned circuit can be avoided.

According to the transistor protection circuit 10 of the present embodiment, the short-circuit controller 16 causes short circuit in the gate terminal of the transistor 20 after the gate voltage of the transistor 20 declines to the threshold voltage or lower, preventing an excessive surge voltage from occurring during short circuit.

According to the transistor protection circuit 10 of the present embodiment, the drive controller 18 turns the switch element 34H of the selection circuit 34 OFF and stops the application of the high-potential-side voltage of the power supply 40 to the gate terminal of the transistor 20 after the predetermined delay time period elapses since the reception of the protection command signal. Thus, lowering the high-potential-side voltage of the power supply by means of the power supply controller 12 can be stopped after the predetermined delay time period elapses. As a result, when, for example, this power supply voltage is used in another circuit in the power electronics circuit, the power supply voltage can be prevented from declining more than necessary, and discontinuation of the operation of the abovementioned circuit can be avoided. Furthermore, an excessive level of current is prevented from flowing when short circuit is caused by the gate short-circuit part 14.

Furthermore, according to the transistor protection circuit 10 of the present embodiment, turning the switch element 34L of the selection circuit 34 ON by means of the drive controller 18 after the predetermined delay time period elapses since the reception of the protection command signal, can assist in causing short circuit in the gate terminal of the transistor 20.

According to the transistor protection circuit 10 of the present embodiment, the drive controller 18 continues the application of the high-potential-side voltage of the power supply 40 to the gate terminal of the transistor 20 while keeping the switch element 34H of the selection circuit 34 ON, before the predetermined delay time period elapses since the reception of the protection command signal. Thus, prior to the lapse of the predetermined delay time period, the power supply controller 12 can appropriately perform soft interruption of the transistor 20.

The present invention is not limited to the present embodiment described above and can be modified in various forms. For instance, the present embodiment illustrates the transistor protection circuit 10 having all of the power supply controller 12, the short-circuit controller 16 (and the gate short-circuit part 14), and the drive controller 18, but the transistor protection circuit may only have the power supply controller 12 and the short-circuit controller 16 (and the gate short-circuit part 14), or may only have the power supply controller 12 and the drive controller 18. Also, the transistor protection circuit may only have the power supply controller 12.

Moreover, in the present embodiment, the predetermined delay time period in the drive controller 18 is the same as the predetermined delay time period in the short-circuit controller 16. However, the predetermined delay time period in the drive controller 18 may be shorter than the predetermined delay time period in the short-circuit controller 16. In other words, when at least the short-circuit controller 16 causes short circuit in the gate terminal of the transistor 20, the drive controller 18 may turn OFF the switch element 34H of the selection circuit 34 of the drive circuit 30.

What is claimed is:

1. A transistor protection circuit for protecting a voltage-driven transistor that is switch-controlled by the application of a high-potential-side voltage or low-potential-side voltage of a power supply to a gate terminal of the transistor by a drive circuit, the transistor protection circuit comprising:

a power supply controller that gradually lowers the high-potential-side voltage of the power supply upon receiving a protection command for executing protection of the transistor;

a gate short-circuit part for causing short circuit in the gate terminal and a source or emitter terminal of the transistor; and a short-circuit controller for controlling the gate short-circuit part so as to cause short circuit in the gate terminal and the source or emitter terminal of the transistor in response to the protection command, wherein the short-circuit controller controls the gate short-circuit part so as to cause short circuit in the gate terminal and the source or emitter terminal of the transistor after a predetermined delay time period elapses since the reception of the protection command, and wherein the predetermined delay time period is equal to or longer than a time period required for the voltage, which is applied to the gate terminal of the transistor, to decline to a threshold voltage of the transistor.

2. The transistor protection circuit according to claim 1, further comprising:

a drive controller that controls the drive circuit so as to stop the application of the high-potential-side voltage of the power supply to the gate terminal of the transistor in response to the protection command, wherein the drive controller controls the drive circuit so as to stop the application of the high-potential-side voltage of the power supply to the gate terminal of the transistor after the predetermined delay time period elapses since the reception of the protection command.

3. The transistor protection circuit according to claim 2, wherein the drive controller controls the drive circuit so as to continue the application of the high-potential-side voltage of the power supply to the gate terminal of the transistor before the predetermined delay time period elapses since the reception of the protection command.

4. A transistor protection circuit for protecting a voltage-driven transistor that is switch-controlled by the application of a high-potential-side voltage or low-potential-side voltage of a power supply to a gate terminal of the transistor by a drive circuit, the transistor protection circuit comprising:

a power supply controller that gradually lowers the high-potential-side voltage of the power supply upon receiving a protection command for executing protection of the transistor; and a drive controller that controls the drive circuit so as to stop the application of the high-potential-side voltage of the power supply to the gate terminal of the transistor in response to the protection command, wherein the drive controller controls the drive circuit so as to stop the application of the high-potential-side voltage of the power supply to the gate terminal of the transistor after a predetermined delay time period elapses since the reception of the protection command.

5. The transistor protection circuit according to claim 4, wherein the drive controller controls the drive circuit so as to continue the application of the high-potential-side voltage of the power supply to the gate terminal of the transistor before the predetermined delay time period elapses since the reception of the protection command.

6. A transistor protection circuit for protecting a voltage-driven transistor that is switch-controlled by the application of a high-potential-side voltage or low-potential-side voltage of a power supply to a gate terminal of the transistor by a drive circuit, the transistor protection circuit comprising:

a power supply controller that gradually lowers the high-potential-side voltage of the power supply upon receiving a protection command for executing protection of the transistor;

a gate short-circuit part for causing short circuit in the gate terminal and a source or emitter terminal of the transistor;

a short-circuit controller for controlling the gate short-circuit part so as to cause short circuit in the gate terminal and the source or emitter terminal of the transistor in response to the protection command; and a drive controller that controls the drive circuit so as to stop the application of the high-potential-side voltage of the power supply to the gate terminal of the transistor in response to the protection command, wherein the short-circuit controller controls the gate short-circuit part so as to cause short circuit in the gate terminal and the source or emitter terminal of the transistor after a predetermined delay time period elapses since the reception of the protection command, and wherein the drive controller controls the drive circuit so as to stop the application of the high-potential-side voltage of the power supply to the gate terminal of the transistor after the predetermined delay time period elapses since the reception of the protection command.

7. The transistor protection circuit according to claim 6, wherein the drive controller controls the drive circuit so as to continue the application of the high-potential-side voltage of the power supply to the gate terminal of the transistor before the predetermined delay time period elapses since the reception of the protection command.

* * * * *